(12) United States Patent
Chiplonkar et al.

(10) Patent No.: US 10,459,993 B2
(45) Date of Patent: Oct. 29, 2019

(54) GUIDED PROGRESSIVE SEARCH SYSTEM AND METHOD

(71) Applicant: SIEMENS PRODUCT LIFECYCLE MANAGEMENT SOFTWARE INC., Plano, TX (US)

(72) Inventors: Lalit Chiplonkar, Mason, OH (US); James Dehmlow, Bellevue, WA (US); Sandip Patil, Cincinnati, OH (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 688 days.

(21) Appl. No.: 14/964,278

(22) Filed: Dec. 9, 2015

(65) Prior Publication Data
US 2017/0169112 A1 Jun. 15, 2017

(51) Int. Cl.
| | |
|---|---|
| G06F 16/9535 | (2019.01) |
| G06F 16/2455 | (2019.01) |
| G06F 3/048 | (2013.01) |
| G06F 17/50 | (2006.01) |
| G06F 16/332 | (2019.01) |

(52) U.S. Cl.
CPC .......... *G06F 16/9535* (2019.01); *G06F 3/048* (2013.01); *G06F 16/2455* (2019.01); *G06F 16/3328* (2019.01); *G06F 17/50* (2013.01)

(58) Field of Classification Search
CPC ..................... G06F 17/30867; G06F 17/30477
USPC ........................................................ 707/754
See application file for complete search history.

(56) References Cited

U.S. PATENT DOCUMENTS

| | | |
|---|---|---|
| 6,789,071 B1 | 9/2004 | Kapoor et al. |
| 7,149,983 B1 | 12/2006 | Robertson et al. |
| 7,281,000 B2 | 10/2007 | Kapoor et al. |
| 7,912,875 B2 * | 3/2011 | Gosper ............ G06F 17/30643 707/805 |
| 8,150,816 B2 | 4/2012 | Lim |
| 8,332,420 B2 | 12/2012 | Kaiser |
| 8,892,540 B2 | 11/2014 | Walker et al. |
| 8,982,984 B2 | 3/2015 | Eliaz |
| 2005/0044100 A1 * | 2/2005 | Hooper ............ G06F 17/30265 |
| 2006/0294311 A1 | 12/2006 | Fu et al. |

(Continued)

OTHER PUBLICATIONS

Amazon.com, Inc, "Amazon.com: CPU Processors: Electronics", Dec. 2015.

(Continued)

*Primary Examiner* — Jean B Fleurantin

(57) ABSTRACT

A system and method is provided that facilitates a progressive guided search for PLM objects. The system may comprise a processor configured to generate a GUI that enables a plurality of objects classified by library nodes to be searchable via a selection of one or more library nodes and a selection of one or more filter values for a plurality of filters corresponding to different object features. The processor may be responsive to a selection of a library node and/or filter value: to determine a subset of objects having object features corresponding to the selection; to cause the subset of objects to be displayed in the GUI; to determine a second plurality of filters based on the determined subset of objects; and to cause the second plurality of filters to be displayed in the GUI in an order based on the filter values associated with the second plurality of filters.

20 Claims, 7 Drawing Sheets

(56) References Cited

U.S. PATENT DOCUMENTS

| | | |
|---|---|---|
| 2007/0217681 A1 | 9/2007 | Potke |
| 2008/0104051 A1* | 5/2008 | Gosper ............. G06F 17/30643 |
| 2009/0248666 A1 | 10/2009 | Ahluwalia |
| 2011/0225180 A1 | 9/2011 | Liao |
| 2011/0246456 A1 | 10/2011 | Weitz et al. |
| 2013/0218872 A1 | 8/2013 | Jehuda |
| 2014/0358893 A1 | 12/2014 | Parasuram |
| 2015/0356187 A1* | 12/2015 | Konik ............... G06F 17/30867 |
| | | 707/706 |

OTHER PUBLICATIONS

Murveit et al.; "Progressive-Search Algorithms for Large-Vocabulary Speech Recognition"; HLT '93 Proceedings of the workshop on Human Language Technology; 1993; pp. 87-90; Association for Computational Linguistics; Stroudsburg, PA.

* cited by examiner

FIG. 2

| Filter | Filter Value (Number of Objects with Filter Value) | Total Number of different Filter Values | Total Number of Objects having the Filter Values |
|---|---|---|---|
| A1 | F1(100) != Unassigned | 1 | 100 |
| A2 | F2(1), F3(9), F4(10) | 3 | 20 |
| A3 | F5(20), F6(30), F7(10), F8(15), F9(5) | 5 | 80 |
| O1 | F10(35), F11(35) | 2 | 70 |
| O2 | F12(5), F13(10), F14(10), F15(5) | 4 | 30 |
| A4 | F16(100) = Unassigned | 1 | 100 |
| A5 | F17(20), F18(30), F19(20), F20(10) | 4 | 80 |
| A6 | F21(1)...F100(1) = each filter value has one distinct value (e.g. real number representing length) | 80 | 80 |
| A7 | F101(50), F102(20), F103(10) | 3 | 80 |
| A8 | F104(40), F105(35), F106(5) | 3 | 80 |
| A9 | F107(30), F108(25), F109(25) | 3 | 80 |
| A10 | F110(50), F111(50) | 2 | 100 |

FIG. 3

| Filter (202) | Primary Sort (304) | Secondary Sort (306) | Tertiary Sort (308) | Quaternary Sort (310) | Notes |
|---|---|---|---|---|---|
| 302 | Groups having either 1 or >1 different filter values | Total Number of Objects having the Filter Values | Closeness of the number of different Filter Values to a predetermined value (4) | Range of the number of Objects for the different Filter Values | |
| A10 | >1 | 100 | ABS[2-4]=2 | N/A < 2 filters after other sorts to left | In first group after Primary sort with Highest total number of objects in Secondary sort |
| A5 | >1 | 80 | ABS[4-4]=0 | N/A < 2 filters after other sorts to left | Tertiary sort puts A5 above A3, A7-A9 |
| A9 | >1 | 80 | ABS[3-4]=1 | Max[30]-Min[25]=5 | Tertiary sort puts A3, A7-A9 after A5 and Quaternary sort puts A9 at top of collection |
| A3 | >1 | 80 | ABS[5-4]=1 | Max[30]-Min[5]=25 | Quaternary sort puts A3 after A9 |
| A8 | >1 | 80 | ABS[3-4]=1 | Max[40]-Min[5]=35 | Quaternary sort puts A8 after A3 (more even data distributions at top) |
| A7 | >1 | 80 | ABS[3-4]=1 | Max[50]-Min[10]=40 | Quaternary sort puts A7 after A8 (more skewed data distributions at bottom) |
| A6 | >1 | 80 | ABS[80-4]=76 | N/A < 2 filters after other sorts to left | Tertiary sort puts A6 after A8 |
| O1 | >1 | 70 | ABS[2-4]=2 | N/A < 2 filters after other sorts to left | Object Properties (O) intermingled with library Attributes (A) |
| O2 | >1 | 30 | ABS[4-4]=0 | N/A < 2 filters after other sorts to left | Secondary sort puts O2 after O1 |
| A2 | >1 | 20 | ABS[3-4]=1 | N/A < 2 filters after other sorts to left | End of first group as determined by Primary sort |
| A1 SHOWN? | =1 | 100 | ABS[1-4]=3 | N/A for Group with only 1 filter value | Start of second group, single explicit value not shown when user setting: HideSingleValue = TRUE |
| A4 SHOWN? | =1 | 100 | ABS[1-4]=3 | N/A for Group with only 1 filter value | Unassigned filter value not shown when user setting: HideUnassignedValue = TRUE |

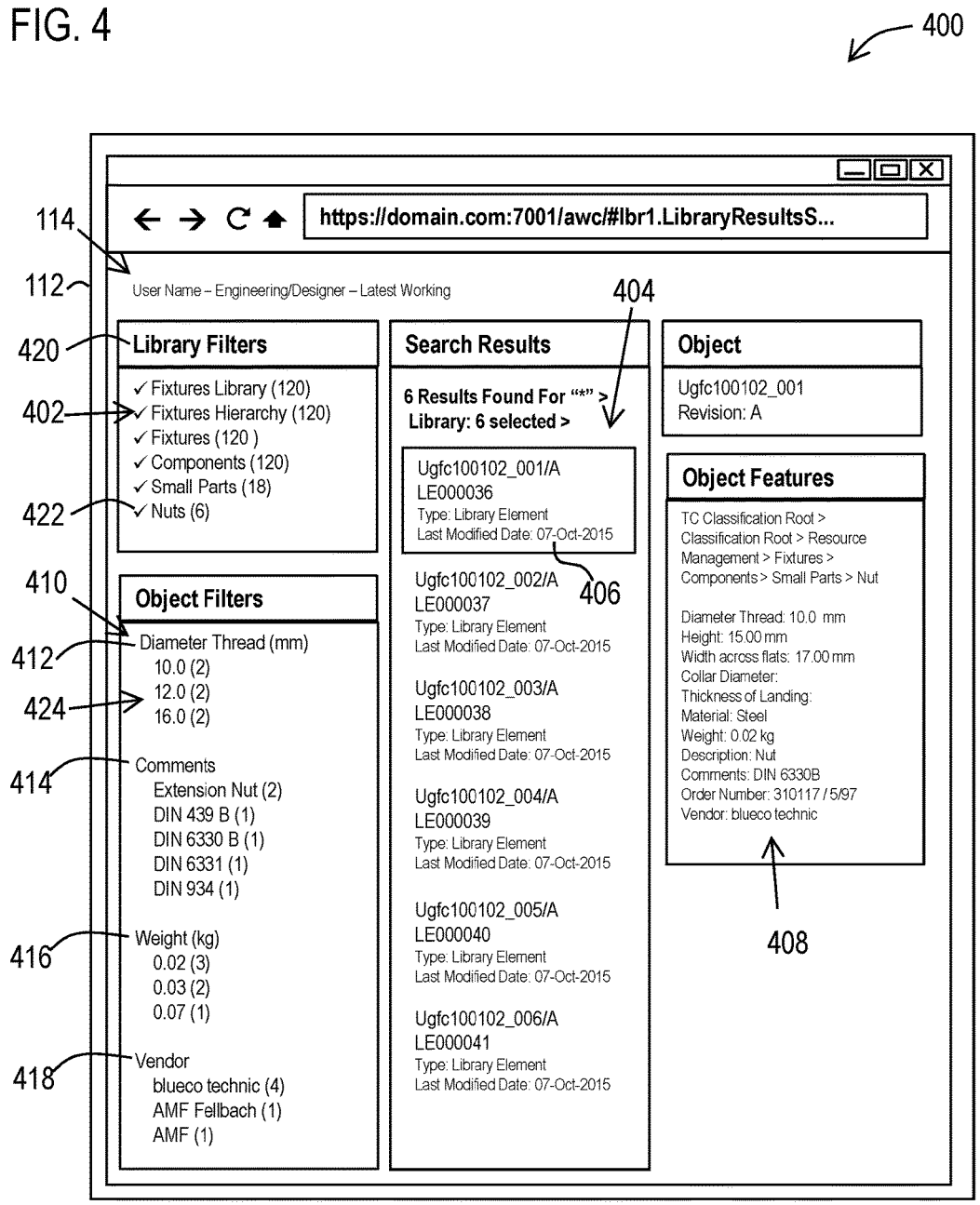

GUIDED PROGRESSIVE SEARCH SYSTEM AND METHOD

TECHNICAL FIELD

The present disclosure is directed, in general, to computer-aided design (CAD), computer-aided engineering (CAE), visualization, and manufacturing systems, product data management (PDM) systems, product lifecycle management (PLM) systems, and similar systems, that are used to create, use, and manage data for products and other items (collectively referred to herein as product systems).

BACKGROUND

Product systems may include stored content associated with products and other items. Such product systems may benefit from improvements.

SUMMARY

Variously disclosed embodiments include data processing systems and methods that may be used to facilitate guided progressive searching of classified library content stored as objects in a product system data store.

In one example, an apparatus for guided progressive searching may comprise at least one processor configured to generate a graphical user interface (GUI) through a display device that enables a plurality of objects stored in a data store and classified by library nodes to be searchable via a selection of one or more library nodes and a selection of one or more filter values for a first plurality of filters corresponding to different object features of the objects. The at least one processor may be configured to be responsive to at least one input through an input device corresponding to a selection of a library node and/or a filter value: to determine a subset of the objects having object features corresponding to the selection; to cause at least some of the subset of objects to be displayed in the GUI; to determine a second plurality of filters that each have at least one filter value based on the determined subset of objects; and to cause at least some of the second plurality of filters to be displayed in the GUI in an order based on the filter values associated with the second plurality of filters.

In another example, a method for guided progressive searching may include various acts carried out through operation of at least one processor. Such a method may include generating a graphical user interface (GUI) that enables a plurality of objects stored in a data store and classified by library nodes to be searchable by the selection of one or more library nodes and by the selection of one or more filter values for a first plurality of filters corresponding to different object features of the objects. The method may also include receiving at least one input through an input device corresponding to a selection of a library node and/or a filter value. Also the method may include responsive to the selection: determining a subset of the objects having object features corresponding to the selection; causing at least some of the subset of objects to be displayed in the GUI; determining a second plurality of filters that each have at least one filter value based on the determined subset of objects; and causing at least some of the second plurality of filters to be displayed in the GUI in an order based on the filter values associated with the second plurality of filters.

A further example may include non-transitory computer readable medium encoded with executable instructions (such as a software component on a storage device) that when executed, causes at least one processor to carry out this described method.

The foregoing has outlined rather broadly the technical features of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiments disclosed as a basis for modifying or designing other structures for carrying out the same purposes of the present disclosure. Those skilled in the art will also realize that such equivalent constructions do not depart from the spirit and scope of the disclosure in its broadest form.

Also, before undertaking the Detailed Description below, it should be understood that various definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

FIG. 2 illustrates an example table showing example filters and filter values for an example set of objects determined via a progressive search.

FIG. 3 illustrates an example table showing a determined order of the filters and the applicable sorts usable to determine the order for the filters.

FIG. 4 illustrates an example implementation of a web page based GUI that facilitates guided progressive searching of classified library content in a product system.

DETAILED DESCRIPTION

Figure 1:
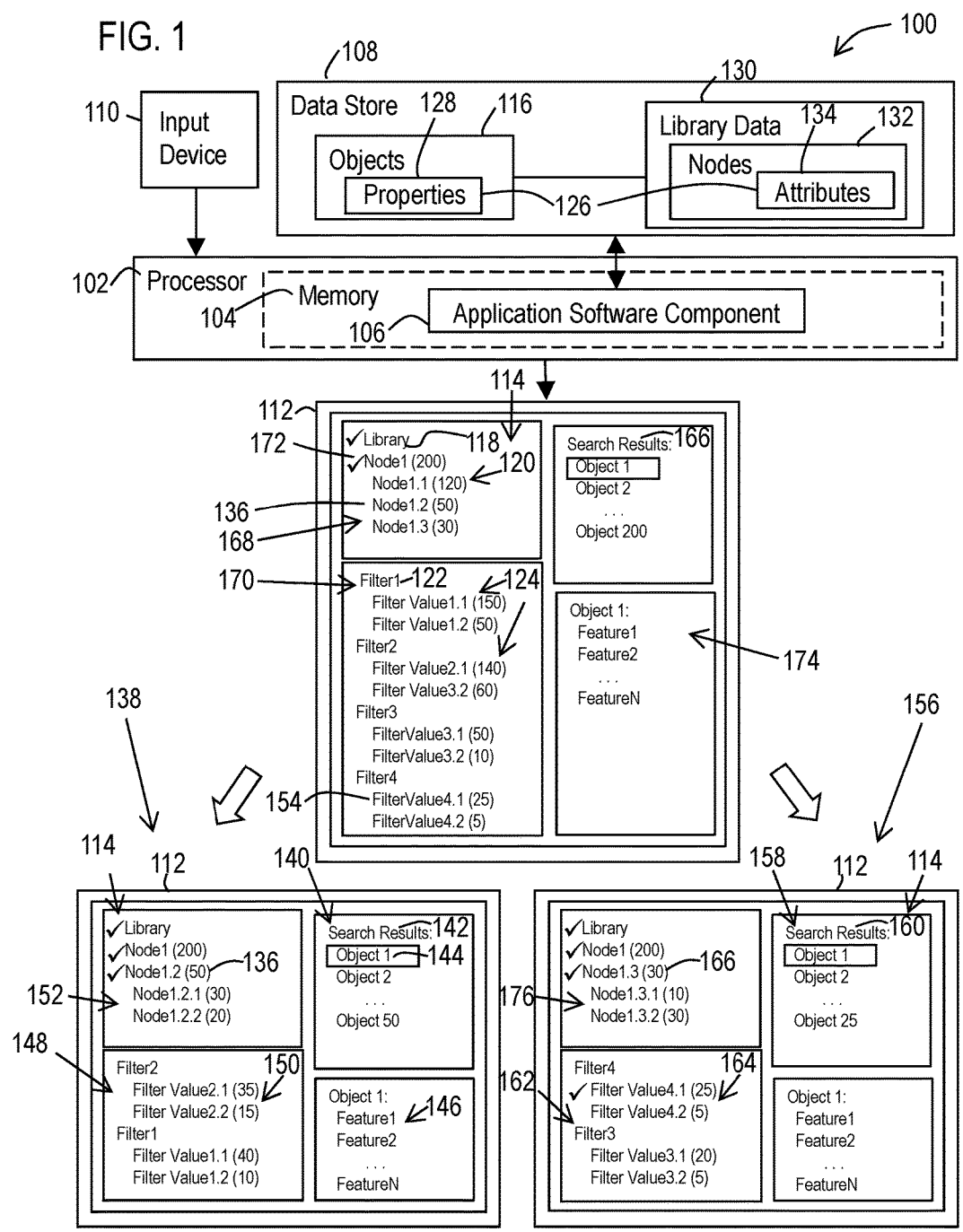
FIG. 1 illustrates a functional block diagram of an example system that facilitates guided progressive searching of classified library content in a product system.

Various technologies that pertain to systems and methods for guided progressive searching of classified library content in a product system will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

With reference to FIG. 1, an example data processing system 100 is illustrated that facilitates guided progressive searching. The processing system 100 may include at least one processor 102 that is configured to execute at least one application software component 106 from a memory 104 accessed by the processor. The application software component may be configured (i.e., programmed) to cause the processor to carry out various acts and functions described herein. For example, the described application software component 106 may include and/or correspond to one or more components of PLM software application that is configured to generate and store product data in a data store 108 such as a database.

Examples of PLM systems that may be adapted to include the guided progressive search features described herein may include the Active Workspace features of Teamcenter, the NX suite of applications, Solid Edge, and/or LMS Imagine.LAB applications, all of which applications are produced by Siemens Product Lifecycle Management Software Inc., of Plano Tex. However, it should be appreciated that the systems and methods described herein may be used in other product systems (e.g., PLM, PDM systems) and/or any other type of system that generates and stores product data in a database. Also, examples of databases that may be used as one or more data stores described herein include database server applications such as Oracle, Microsoft SQL Server, or any other type of data store that is operative to store data records.

It should be appreciated that it can be difficult and time-consuming to conduct comprehensive searches for objects (e.g., data records representing/storing data corresponding to parts, tools, documents, process descriptions, templates, materials) in complex, production PLM environments. For example, a PLM database may be configured to store many different types of objects, and each object type may include many searchable object properties.

To simplify searches, a classification strategy may be employed that minimize redundancy. For example, in PLM databases, objects may be classified into a specific class (e.g., library node) of a tree-structured classification hierarchy (e.g., library) in which attribute values associated with objects are used to capture the key characteristics of the object and can be used subsequently to search for and find these objects.

However, even when a classification strategy is used, it may not be intuitive to the end user how to construct search queries that combine the branch or class (e.g., library node) of interest in the classification hierarchy (e.g., library), object properties, classification/library attributes and full text content in a seamless fashion. Often the cognitive load on the user can be overwhelming as they try to understand how the information has been categorized, what search terms can be used effectively, and what data has been loaded into the system.

To simply searches by end users, PLM systems may enable administrators to define static views for searching that present a particular set of classification attributes for a specific classification class (e.g., library node) based on the user, group or role. However, it may often be the case that some of the attributes shown do not actually help the user further reduce the search results to find the desired library/classified content. Also, the use of static search sceneries may not be able to address a majority of all possible search scenarios, even with the investment of significant upfront and ongoing administrative labor and costs to develop and manage static views (to display search filters) for different library nodes, users, groups, roles, and/or projects To enhance the searching of complex PLM data and to minimize the need for static views, an example embodiment of the application software component 106, may be configured to carry out dynamic data analysis to optimize the presentation of search filters when searches are conducted in the context of library/classification systems. In such an example, this described embodiment may dynamically determine and display search filters in an order that is optimized to reduce the cognitive load on the user so faster filter selections can be made to find the desired library content.

As will be explained in more detail below, search filters correspond to different features (such as a property or attribute) associated with one or more objects. As the object feature may have different values depending on the object (e.g., a material property, length property or other variable aspect of the objects), such filters also include one or more selectable filter values corresponding to the different features of the object. Thus a filter for a material property may include a list of user selectable filter values representing the different materials of steel, plastic, zinc, or other material types for the objects stored in the data store applicable to the current search results. Also a filter for a weight property for the same set of objects may list different selectable filter values corresponding to the different weight amounts for the objects. It should be appreciated that a set of objects may have many filters, each having many applicable filter values, depending on the number of features stored in the data store for the objects and the number of different values that are stored for each feature for the objects.

In an example embodiment, when a search is being carried out, the search filters may dynamically change with each step of a progressive search sequence such that the most applicable filters (largest intersection of filter values to remaining search results) are displayed to the user in a prominent manner. Such an embodiment may help a user further reduce search results by making it easy to access the most useful search filters.

To enable the described application software component 106 to carry out these features, the described processing system 100 may include at least one input device 110 and at least one display device 112 (such as a display screen). The described processor 102 may be configured to generate a GUI 114 through the display device 112. Such a GUI may include GUI elements 174 such as buttons, links, search boxes, lists, text boxes, images, scroll bars) usable by a user to provide inputs through the input device 110 that cause a search to be carried out to determine search results 166 that list a plurality of objects 116 from a data store 108 consistent with the current search. In this example, the generated GUI 114 may enable the objects 116 to be searchable via a selection of one or more of the library nodes 120 of a hierarchically organized library 118 (by which the objects may be classified) and a selection of one or more filter values 124 for a first plurality of filters 122 (corresponding to different object features 126 of the objects). Such selectable library nodes may be displayed in a segregated library location 168 in the GUI and the selectable filter values 124 may be displayed in a vertically lower segregated filter location 170 of the GUI. However, in alternative embodiments, the GUI may be configured to arrange the selectable library nodes and filter values in other relative locations on the display screen.

In this example, the library 118 and library nodes 120 displayed by the GUI may be determined from library data 130 stored in the data store 108. Such library data may represent a user configurable classification system having many levels of classes/subclasses (i.e., node data 132). Also, library nodes may include one or more attributes 134 assignable to objects. In example embodiments, the object features 126 may correspond to object properties 128 (such as length dimensions and weight). In addition object features 126 may correspond to library attributes 134 (such as a component type) associated with the objects, that enable the classification of the objects in different nodes 132 of the library data 130.

In this described embodiment, the GUI 114 enables searching for objects 126 (from the current search results 166) based on object features 126 and/or library nodes 132 that are associated with the objects. For example, a typical search may begin with a user providing inputs corresponding to a selection of a library 118 and optionally one or more nodes of a library 120. With each selection, the processor may be operative to determine more refined (i.e., smaller) search results 166 that list the objects 116 from the data store that are classified as being included in the selected library/library node(s). The GUI 114 in FIG. 1 illustrates an example search in which the library 118 and a first library node 172 have been selected. Also once a suitable library and one/or more nodes have been selected, the user may then begin to further refine the search results 166 by selecting filter values 124 of the filters 122.

In this example, the displayed library nodes 120 and displayed filter values 124 correspond to GUI elements capable of being individually selected by one or more inputs through the input device 110 (e.g., mouse click, touch screen finger tap). For example, the processor 102 may be configured to be responsive to at least one input through the input device 110 corresponding to at least one selection of at least one library node 120 and/or filter value 124 to carry out the following described functions based on the selection, which facilitate the further refinement of the search results.

For example, if the user selects the library node 136 from the list of upper level nodes 120, the GUI may be updated as shown in GUI view 138. The functions carried out responsive to this selection may include the determination of a subset of the objects 140 having at least one object feature (i.e., a library attribute) corresponding to the selected library node (i.e., classified under the selected library node). Such functions may also include the display of search results 142 corresponding to a list of at least some of the subset of objects 140 in the GUI. In this example, one object 144 of the determined subset of objects is shown selected, which produces the display of the selected object's features (i.e., properties/library attributes) 146. It should be appreciated that a user may select other objects in the subset of objects 140 in the list of search results 142, to cause the GUI to display the features for the selected object.

In addition to displaying the search results 142, such functions may include a determination of a second plurality of filters 148 based on the determined subset of objects 140. In addition, these functions may include the display of at least some of the second plurality of filters and associated filter values in the GUI in an order based on the filter values 150 associated with the second plurality of filters. Also in this example, the functions may include the display of additional nodes 152 that are sub branches of the selected node 136. It should be appreciated that these additional nodes 152 and the displayed filter values 150 are also selectable to cause these described functions to be carried out again. This process of selecting library nodes and/or filters and updating the display of library nodes and filters may be carried out progressively until the user locates the objects of interest to the user.

In another example, if the user selects the filter value 154 from the list of filters/filter values 122/124, the GUI may be updated as shown in GUI view 156. The functions carried out responsive to this selection may include the determination of a subset of the objects 158 having at least one object feature corresponding to the filter value selection. Such functions may also include the display of search results 160 corresponding to a list of at least some of the subset of objects 158 in the GUI.

In addition to displaying the search results 160, such functions may include a determination of a second plurality of filters 162 based on the determined subset of objects 158. In addition, these functions may include the display of at least some of the second plurality of filters and associated filter values in the GUI in an order based on the filter values 164 associated with the second plurality of filters. Also in this example, the functions may include the display of one or more addition nodes 166 for which the subset of objects are classified (via library attributes) in the library 118, as well selectable sub nodes 176 usable to further refine the search.

As discussed previously, the order of the determined filters 122, 148, 162 displayed in the GUI may be based on characteristics of the filter values 124, 150, 164 associated with the filters. To illustrate the manner in which the application software component 106 may be configured to determine the displayed filter order, FIG. 2 shows an example table 200 of filters 202 (e.g., A1, A2 . . . ) that may be determined based on an example set of search results for objects included in a PLM database. In this example the current search results include a total of 100 objects. Also, the filters with an A prefix correspond to object features for library attributes classified in a classification library of the data store. In addition, the filters with an O prefix correspond to object features for object properties.

The table 200 also includes a list of filter values 204 (e.g., F1, F2 . . . ) associated with each filter which correspond to the different values for the object features in the set of objects for the current search results. In this example, each filter value is shown with a number 206 in parentheses that corresponds to the count of objects in the search results that are associated with this particular filter value. Selecting one of these filter values (when displayed in a GUI) may update the search results to have a smaller number of objects corresponding to this count value. For example, the filter value F10 for the filter O1 for an object property, is associated with 35 objects in the current search results. Thus selecting this filter would produce new current search results with only 35 objects, all having the F10 filter value for the O1 object property.

In addition, the table 200 summarizes for each filter 202, the total number of different filter values 208 and the total number of objects 210 in the search results having the filter values. As discussed previously, each filter may correspond to an object feature (property, library node/attribute), and the filter value may correspond to a particular value for the object feature. For example, an object corresponding to a nut fastener may include object features such as a weight property, a width property, and a library classification attribute representing compliance with an industry standard. Corresponding values stored for these features in the data store may include a weight of 0.02 kg, a width of 17 mm, and data indicating compliance with the DIN 6330 B industry standard. In a relational database type of data store, such properties for each object may be stored in one or more different database records in one or more different database tables.

FIG. 3 illustrates an example table 300 that shows a new determined order 302 (shown in the vertical direction) for the determined filters 202 shown in FIG. 3 that may be determined by the application software component 106 in this example. When the GUI is updated to display the object search results, the application software component may be configured to order the display of filters in the GUI in the vertical order 302 of the filters 202 shown in FIG. 3. It should be understood that with each step of the progressive search, the user selects a filter value (or navigates through the library hierarchy) to reduce the size of the search results. If the most important filters are positioned in a prominent position in the GUI (e.g., at the top of a list such as illustrated in FIG. 3) then users spend less time looking for the desired filter (e.g., no need to scroll down through a long list of filters) and can complete the progressive search much faster. In a complex PLM deployment with a large number of users (e.g., 1000) this may save significant labor costs over the lifetime of the product system.

Table 300 also shows examples of several types of sorts 304, 306, 308, 310 in adjacent columns that may be applied successively (e.g., primary, secondary, tertiary and quaternary sorts) to produce the sort order for the filters 202. However, it should be appreciated that in alternative examples, other types of sorts may be applied in a different order to determine the order of the filters. Further, these example types of sorts are not exhaustive. Alternative embodiments may use alternative, and/or additional sorts to base the order of the filters displayed in the GUI.

When the number of different filter values equals one, then selecting that filter value does not further reduce the search results and therefore does not generally aid the user in finding the desired content. Thus, in this described embodiment, the filters with more than 1 filter value are prioritized in the GUI display. To achieve this functionality, a primary sort 304 may be based on whether the filter has a total number of different filter values that is greater than one (and is assigned to a first group), or has a total number of different filter values that equals one (and is assigned to a second group). The application software component may be configured to list the first group of filters (with >1 different filter value) in the GUI, vertically higher than the second group of filters (with only 1 different filter value). Thus, as shown in FIG. 3, the filters, A1 and A4 are listed in the GUI vertically lower than all of the other filters.

As shown in FIG. 3, after the primary sort 304 is used to sort the filters, several filters have >1 different filter values. Thus, a secondary sort 306 may be carried out on these filters to further determine their order. In this example, the secondary sort may be based on the total number of objects having the filter values for each filter in order to prioritize the filters with the best data intersection with the current search results. Such filters may correspond to the most relevant filters given the data in the data store and the current state of the progressive search. Thus, after the primary sort, the filters having >1 different filter values may be sorted according to the secondary sort to place filters with the highest number of total objects having the filter, vertically higher than the filters with a lower number of total objects having the filter values. In this example, the filter A10 has filter values for 100 objects in the current search results, and thus is placed vertically higher than all of the other filters. It should be understood that this described number of total objects can be computed by including the count of objects that have an unassigned filter value or excluding the count of objects that have an unassigned filter value. The GUI may be configured to have this counting method controlled by a configuration setting.

As shown in FIG. 3, after the secondary sort 306 is used to sort the filters, several filters (A3, A5-A9) have the same total number of objects having their filter values of 80. Thus, a tertiary sort 308 may be carried out on these filters to further determine their order so as to minimize the cognitive load on the user when reviewing filters and filter values for subsequent selection when continuing the progressive search. For example, a user can quickly review 4 or 5 filter values, but it is much more time consuming to review 100 filter values. Thus, in this example, the tertiary sort 308 may be based on how close the number of different filter values for a filter is to a preferred predetermined number (such as 4 or 5 filter values)

Thus, a group of filters ranked the same after the primary sort and secondary sort, may be ordered in the GUI such that filters with a number of different filter values closer to the predetermined number are displayed vertically higher than filters with a number of different filters values that are farther from the predetermined value. The predetermined number for example may correspond to a value of 4, 3, 5 or other number that is used to distinguish which filters have a more useful number of different filter values to further limit the search results, and thus are placed higher vertically in the ordered list of filters presented to the user.

In this example tertiary sort, filters with a "handful" (e.g., 4 values) are positioned at the top and those filters with larger numbers of values are pushed down in the display because it may take longer for the user to review more values before selecting a filter value to continue the search sequence. For example, selection of one out of ten different filter values may reduce the search results by 90% on average with a single filter selection. However, the time for a user to read through and evaluate such a large list may take much longer than the user simply selecting filter values from different filters (one after the other) that have only four different filter values per filter (which still reduce the search results by 75% on average with a single filter selection and can lead to shorter overall times to complete a progressive search since each filter value selection is easier for the user to determine and thus takes less time).

The determination of closeness of filters to the predetermined value may be made by any type of algorithm including mathematical calculations, lookup tables, and/or logical comparisons. For example in one embodiment the absolute value difference between a predetermined number (such as 4) and the total number of different filter values for a filter may produce a calculated value that is used to sort the filters (from lowest to highest calculated values). In this example, the filter A5 has a total number of different filters of 4 (see FIG. 2) and has the lowest value calculated in this manner (e.g., ABS[4-4]=0). Thus the A5 filter is ordered vertically higher than the other filters having a total number of objects of 80. Also in this example, the filter A6 is ordered vertically lower than the other filters having a total number objects of 80 because its total number of different filters is 80, and thus has the highest value calculated in this manner (ABS[80-4] =76).

In other examples, a predetermined lookup table may be used to determine closeness to a particular predetermined value. For example, such a lookup table may include comparison data of [4, 3, 5, 2, 6, >6], in which the first entry is the desired predetermined number and the following values are generally listed in an order that is farther away from the first value. With such a table, the number of different filters values for each filter could be compared to the numbers in this table, and the order of the filter is determined based on the position in the table in which a match is found. Thus filters with 3 different filter values would be placed vertically higher than filters with 6 different filter values for this tertiary sort.

Also, it should be appreciated that other embodiments may use any other algorithm for this described tertiary sort, which orders filters by closeness to a preferred desired number of different filter values. Also, in example embodiments the predetermined value (or predetermined lookup table) used in the tertiary sort calculation may be user configurable via a settings menu in the GUI of the application software component.

As shown in FIG. 3, after the tertiary sort 308 is used to sort the filters, several filters (A3, A7-A9) with a total number of objects of 80 are still ranked the same as a result of the tertiary sort calculation producing the same value for filters of 1 (e.g., ABS[5-4]=1 and ABS[3-4]=1). Thus, a quaternary sort 310 may be carried out on these filters to further determine their order so as to prioritize even data distributions over skewed data distributions. For example (assume 100 search results), if there is an even data distribution of 4 values in a filter F1(25), F2(25), F3(25), F4(25), then selecting any one of these guarantees a 100% probability that the search results are reduced by 75%. With a skewed data distribution such as F1(97), F2(1), F3(1), F4(1) there is a 97% probability of reducing the search results by 3% and a 3% probability of reducing the search results by 99%. So the even data distribution may provide more predictable results (and is less of a "gamble" for the user in terms of search efficiency and total time spent searching). In this example, the quaternary sort 310 may be based on a range of the number of objects for the different filter values for each filter. Thus, a group of filters ranked the same after the first, second, and third sorts, may be ordered in the list of filters via how narrow or wide are the ranges of the number of objects for the different filters values of the filters (i.e., smaller ranges are displayed vertically higher).

As shown in FIG. 3 the filter A9 has a calculated range of 5 and has the lowest value for the quaternary sort calculation for the group of filters A3, A7-A9 that were ranked the same after the primary, secondary, and tertiary sorts. Thus the A9 filter is ordered vertically higher than the other filters A3, A7, A8. In this example, the range of 5 may be calculated by determining: that filter value F107 (shown in FIG. 2) has the largest (i.e., maximum) number of different objects (a count of 30) that would remain in the search results after the selection of this filter value; and that the other filter values of F108 or F109 have the smallest (i.e., minimum) number of different objects (counts of 25); and subtracting the maximum number from the minimum number (MAX[30]−MIN[25]=5).

The same calculation for the A2 Filter produces a range of 25 (MAX[30]−MIN[5]=25) and thus the A2 Filter would be ordered vertically lower than the A9 filter in this example.

It should be noted that after the quaternary sort, alternative embodiments may carry out other sorts (if needed) to distinguish which filters should be presented vertically higher in the GUI than other filters. Also, it should be appreciated that a smaller number of sorts may be carried out in some examples. Further after one or more sorts are carried out, any remaining ties between filters may be broken by basing any further sort based on the alphabetical order for the name of the filter, a random order, or any other calculation or process that can be used to determine the final vertical order of the filters.

In example embodiments, objects in the data store may be indexed to enhance the performance of the system. For example indexes may be generated for object features or other aspects of the data in order to increase the speed at which filters, the order of filters, and the number of objects for different filter values can be determined for the current search results. In order to enhance usability, an example embodiment may be configured via indexes so as to be capable of meeting a search results retrieval threshold (such as 2 seconds of elapsed time or less) for the amount of time it takes the described application software component to respond to a user input (e.g., filter value selection) and update the GUI for each step of the progressive search.

The described examples may provide an efficient way for users to find virtually any type of object data (e.g., parts, tools, documents, process descriptions, templates, materials, or any other type of product data) stored in a library by enabling the search filters to be presented in an order optimized for the current search results/attempt and reflect the current nodes of the library being searched. Thus, the described examples, may reduce the total cost of ownership of the application software component, by alleviating or at least minimizing the need for administrators to set up and manage views (to display search filters) for different library nodes, users, groups, roles, and projects. Such efficient PLM searches can be leveraged in any industry (e.g., Aerospace & Defense, Automotive & Transportation, Consumer Products & Retail, Electronics & Semiconductor, Energy & Utilities, Industrial Machinery & Heavy Equipment, Marine, or Medical Devices & Pharmaceuticals). Such searches may also be applicable to consumer facing vendor web pages directed to searching for products to purchase from a vendor.

In example embodiments, the described ordering of filters is shown being carried for library search processes, where a user selects a library to begin searching for objects of interest to the user. However, it should be appreciated that the described filters and the described processes of ordering the filters may be carried out and displayed for other or additional types of searches. Such other/additional types of searches may include key word searches, Boolean logic searches, template searches, 3D geometry shape searches (such as the Siemens Geolus engine) or any other type of search in which search results including many objects are produced which may be further refined (i.e., reduced in number) via the selection of filter values applicable to the current search results.

For example, in addition to displaying selectable library nodes and selectable filter values, the application software component may enable the GUI to accept information for searching for an object based on shape (e.g., cylindrical versus bracket shaped). In this example, the GUI may accept an input of a seed object (e.g., a part or other object that has a defined shape specified by CAD data). The GUI may also accept an input associated with a threshold (e.g., for the desired relative closeness to the 3D geometric shape of the seed object to search for). Responsive to the input of the seed object and the threshold data, the application software component may be configured to carry out a search of objects in the database with a similar shape within the specified threshold based on shape indexes generated from CAD data for objects in the database. The resulting search results (with similarly shaped objects) maybe then be further refined using the GUI via the selection of library nodes and filter values as described previously.

In further examples the application software component may enable the GUI to refine search results based on relationships between objects. An example of a relationship may be an object representing a part that has a relationships to another object representing an assembly. Such a relationship may correspond to the assembly including the part. The assembly may have properties that may be useful for selecting the part. For example the assembly may have a status such as "released" (to manufacturing), or other feature useful in a search for parts included by the assembly. The PLM database may include indexes which capture such relationships and associations between an object and a feature of a related object. Thus, the example application software component may take advantage of such indexes to determine filters and filter values useful for refining search results based on such relationships and properties of related objects.

In the above example, a determined filter may correspond to a status property for objects related to the objects in the current search results and the filter values may include statuses such as "released", and "undefined" for the related objects. The described GUI may display such a filter and these associated filter values with respective counts for the number of each type of object in the current search results having each status. In example embodiments, such filters based on relationships between objects, may be sorted and displayed among the filters based on object features (such as object properties and library attributes). However, in an alternative embodiment, such determined relationship filters may be segregated in the GUI (e.g., in a separate location) from the previously described filters based on object features. In such an alternative example, the relationship filters may also be sorted based on the sort algorithms described previously.

It should also be appreciated that in other examples, filters may be based on other object relationships defined in the PLM database in order to facilitate searching for objects having relationships with other objects with particular features. In example embodiments, the determination as to which relationship filters to determine for objects and to display in the GUI may be automatically determined and/or may be configurable. For example, the application software component may be operative to determine pre-existing indexes for one or more object relationships, and determine which relationship filters to display and sort based at least in part on which relationships are included in the indexes. Additionally or alternatively, the application software component may enable the GUI to be usable to select which available relationship filters to include in progressive searches for objects.

As discussed previously, the primary sort 304 places filters having only one different filter value in a second group of filters that is vertically lower than a first group of filters with more than 1 different filter value. This ordering ensures that that filters with a single filter value (possibly an unassigned value) are less prominently displayed (since selecting this filter value will not further reduce the number of objects in the search results). In example embodiments the application software component 106 may enable the GUI to permit variables to be set which control whether or not to suppress the display of filters in this first group. For example, the application software component may include a HideSingleValue setting, which when set to true suppresses the display of filters in the GUI having only one different filter value.

In addition, it should be noted that objects may have features (e.g., properties/attributes) that are not filled with values, and such are considered to have an unassigned value. For example a weight of the objects may be empty in the data records for the current search results, thus the weight filter may only have a filter value representing an unassigned value. As a selection of such a filter value would not further reduce the size of the search results, the application software component may include a HideUnassignedValue setting, which when set to true suppresses the display of filters in the GUI having only an unassigned filter value.

Referring now to FIG. 4, an example implementation of the described GUI 114 is illustrated in the form of a web page 400 in a browser (e.g., Google Chrome, Mozilla Firefox, Microsoft Internet Explorer). Here six library nodes 402 have been selected which has produced the search results 404 comprising six objects from an original total of 120 objects in this library. Also, in this example, one of the objects 406 is shown selected (e.g., Ugfc100102_001/A) in the search results, which has caused the GUI to display the object features 408 for this selected object.

With this set of objects in the current search results, the application software component has caused several filters 410 to be displayed in the GUI. It should be noted that the filter order is shown based on the object features for the six objects in the current search results. In this example, the quaternary search was applicable to determine the order for the objects. For example, the Diameter Thread filter 412 is arranged at the top because this filter has a calculated range of 0 based on each of its selectable filter values corresponding to a total of two objects each (e.g., Max[2]−Min[2]=0). Also, the Comments filter 414 is the next vertically lower filter because this filter has a calculated range of 1 based on object counts for its filter values (e.g., Max[2]−Min[1]=1). In addition, the Weight filter 416 is the next vertically lower filter because this filter has a calculated range of 2 based on object counts for its filter values (e.g., Max[3]−Min[1]=2). Further, the Vendor filter 418 is the vertically lowest shown filter because this filter has a calculated range of 3 based on object counts for its filter values (e.g., Max[4]−Min[1]=3).

Such a web page based implementation of a GUI may be carried out in a single data processing system (such as a workstation). However, such an implementation may also be carried out in a distributed data processing system. For example, the described at least one processor 102 shown in FIG. 1, may correspond to at least one processor in one or more of a web server, a database server, and/or an application server as well as a processor in a client device that generates the web page. In this example, the processor(s) in one or more servers may determine the objects for the current search results as well as the filters and the order of the filters, and this data may be communicated to the client device to render the web page. However, it should be appreciated that some of this described functionality may be carried out by the processor in the client device. For example, the order of the filters may be determined (as described above) via java script executing in a web page in a browser on the client device. Thus, in such a distributed example, the described application software component 106 is distributed as well and corresponds to several components such as server software executing in a server as well as the java script that is communicated to the client device for use with rendering the GUI in a browser.

In the example web page 400 shown in FIG. 4, it should be noted that the Library nodes 402 are labeled with the heading 420 of "Library Filters". This heading reflects that the nodes 402 shown on the web page 400 have functionality similar to the described filters 410, in that each (when selectable) can further narrow the search results 404 to include a smaller subset of objects. However, it should be understood that the library nodes in this example are not sorted in the manner described herein for the filters 410. Rather, the library nodes are generally segregated from the filters, such as being displayed vertically above the filters 410. In general, the library nodes as displayed in the GUI with check marks 422 (or other selection indicators) provide a visual organization of branches of a classification library for which the objects in the current search results 404 are classified. As illustrated in FIG. 2, nodes that do not have a check mark, correspond to sub-nodes that are available to be selected to further limit the search results. In contrast, rather than being ordered based on the organization of a classification library, the described elements referred to herein and in the claims as "filters" 410 are displayed in an order according the sort functionality described herein that are based on characteristics of the filter values 424 associated with each filter.

In example embodiments, it should be noted that the particular filters that are vertically higher in the list of filters 410, generally provide a quickly readable and understandable spectrum of selectable filter values in order to enable the end user to efficiently further limit the search results to relevant objects. In example embodiments, such a useful order of the filters may have other uses in addition to refining search results. For example, in a further embodiment, the application software component may generate in the GUI a comparison table based on the current search results. Such a comparison table may display at least some of the features of each object in a tabular form so as to provide enhanced fidelity to make a final decision on the preferred object/selection to complete the task at hand. The order of the object features listed in the comparison table may be based on the order of the corresponding filters for the current search results 404. In some examples, the compare table may be presented in the GUI automatically, when the number of objects in the current search results has been reduced to or below a predetermined number of objects (e.g. such as 5 objects which may be user configurable). However, in other embodiments, the comparison table may be displayed in the GUI for the objects in the current search results responsive to a selection of a compare button, menu item or other selectable GUI element.

Figure 5:
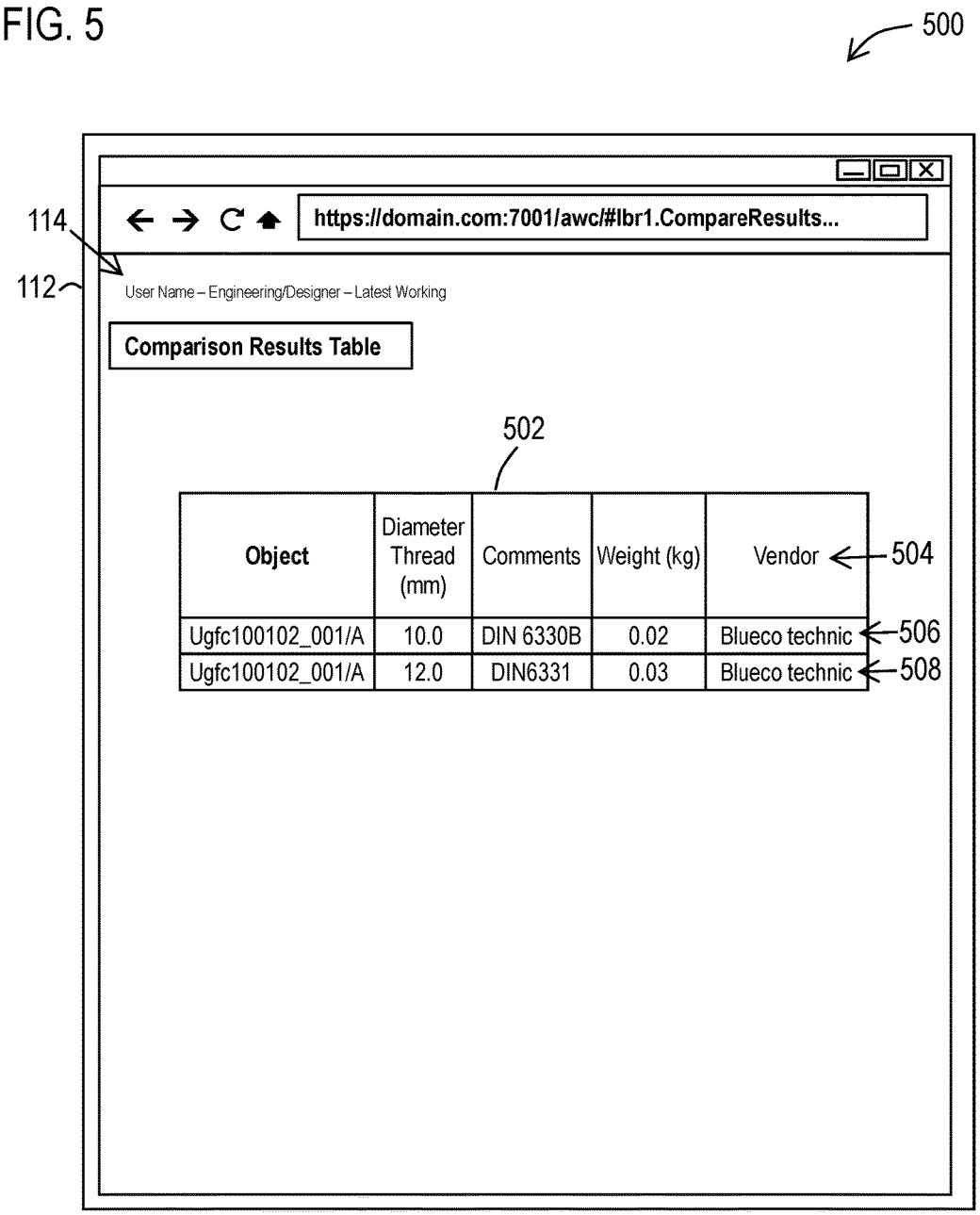
FIG. 5 illustrates an example of a comparison table with object features having an order based on a determined order for filters for search results from which the compared objects were selected.

FIG. 5 illustrates an example 500 of a comparison table 502 that may be generated for the first two objects listed in the search results 404 shown in FIG. 4. Here the table is pre-populated to include a first list 504 (such as a top level row) that labels the object features common to the selected objects that have a high priority based on the order of the filters determined during the search. The table also includes adjacent lists 506, 508 (e.g. such as second and third rows) for each selected object that displays the corresponding values for each object feature for each object. However, it should be appreciated that in alternative embodiments, the table may be transposed to place these labels in a common vertical column (with corresponding values in adjacent columns for each different object).

In this example, the order of the object feature 504 listed for this table may be based on the order of the corresponding filters 410 for the current search results (shown in FIG. 4) from which the objects were selected. Thus, higher priority sets of object features may be shown in a more visible manner in the table based on the algorithms used to determine the sort order of the filters. The number of displayed object features may be a user configurable parameter (such as a value 10). Thus the comparison table may include the top 10 object features (or other number) based on the priority of the filters (i.e., based on the previously described sort algorithms) for the current search results. Any remaining (lower priority) features may be hidden initially.

However, it should be appreciated that additional object features and values may be shown in the comparison table 502, that were initially ranked lower than the initially displayed lists of object features in the comparison table. For example, the application software component may provide the GUI with the capability for the user to arrange the columns/rows and/or to add/remove object features to display in the comparison table. The GUI may provide a GUI button or menu command that provides the user with the ability to view a set of displayed and non-displayed object features for purposes of modifying the comparison table. Such a displayed set of object features may show the current displayed object features followed by a selectable list of non-displayed object features. The non-displayed object features may be ordered alphabetically or based on the priority of the filters (i.e., based on the previously described sort algorithms) for the current search. The GUI may also enable a user to use such a displayed set of object features: to select additional object features to display in the comparison table; to rearrange the order of the object features displayed in the comparison table; and/or to hide object features that were initially populated (or later added) in the comparison table.

It should be understood that PLM databases may be used in industries with very complex production environments. For example, the Automotive & Transportation industry may use PLM databases for capturing all of designs and revisions for all of the components for all of their vehicle models. Classification capabilities of PLM databases and software may help organize such PLM databases and thus may be sufficiently flexible/configurable so as to be applicable to many types of data across PLM industries and use cases. As a result, the designers of PLM databases and software may not know the classification hierarchies up-front, since such classifications hierarchies are defined by the end user.

For such circumstances, the guided search described herein provides a seamless and efficient search and browse mechanism (via filtering) to carry out searches on library classified objects that is applicable to any configuration of a classification hierarchy for the library. The described example provides filter priorities determined dynamically without the need for administrative static prioritization (and the associated more expensive administrative costs).

However, it should also be appreciated that in further example embodiments, the application software component may combine static configuration of filter priorities with the described dynamically determined filter priorities through a weighting technique to get blended behavior between the two mechanisms. For example, the described application software component may provide the GUI with the capability to configure some aspects of the filter priority determination by assigning numerical weights to certain object properties. Such numerical weights may be correspond to another type of sort that is carried out in addition to one of the described primary, secondary, tertiary quaternary sorts discussed previously.

It should also be appreciated that the search results described herein may include lists for other objects that may not match the current set of selected filters values, but may be related objects based on a related data model algorithm (e.g., based on search history data). For example, the application software component may be configured to additionally cause the GUI to display a list of objects that were often selected by the same user or other users for searches, comparisons (and/or other functions) that are classified in the same library nodes as the current search results.

In example embodiments, the application software component may be configured to store user histories of searches in the data store for use with providing additional filter algorithm guidance. For example, the described application software component may be configured to determine which filters are used for searching most frequently and/or filter values selected most frequently. Such data may be used as one of the sorts (e.g., primary, secondary, tertiary, quaternary) to base the order of the filters described previously. Thus, the described application software component may be configured to learn what each user typically searches for and may refine subsequent searches based on prior search histories. Such personalized searching may be carried out at site, group, role and/or user levels.

Figure 6:
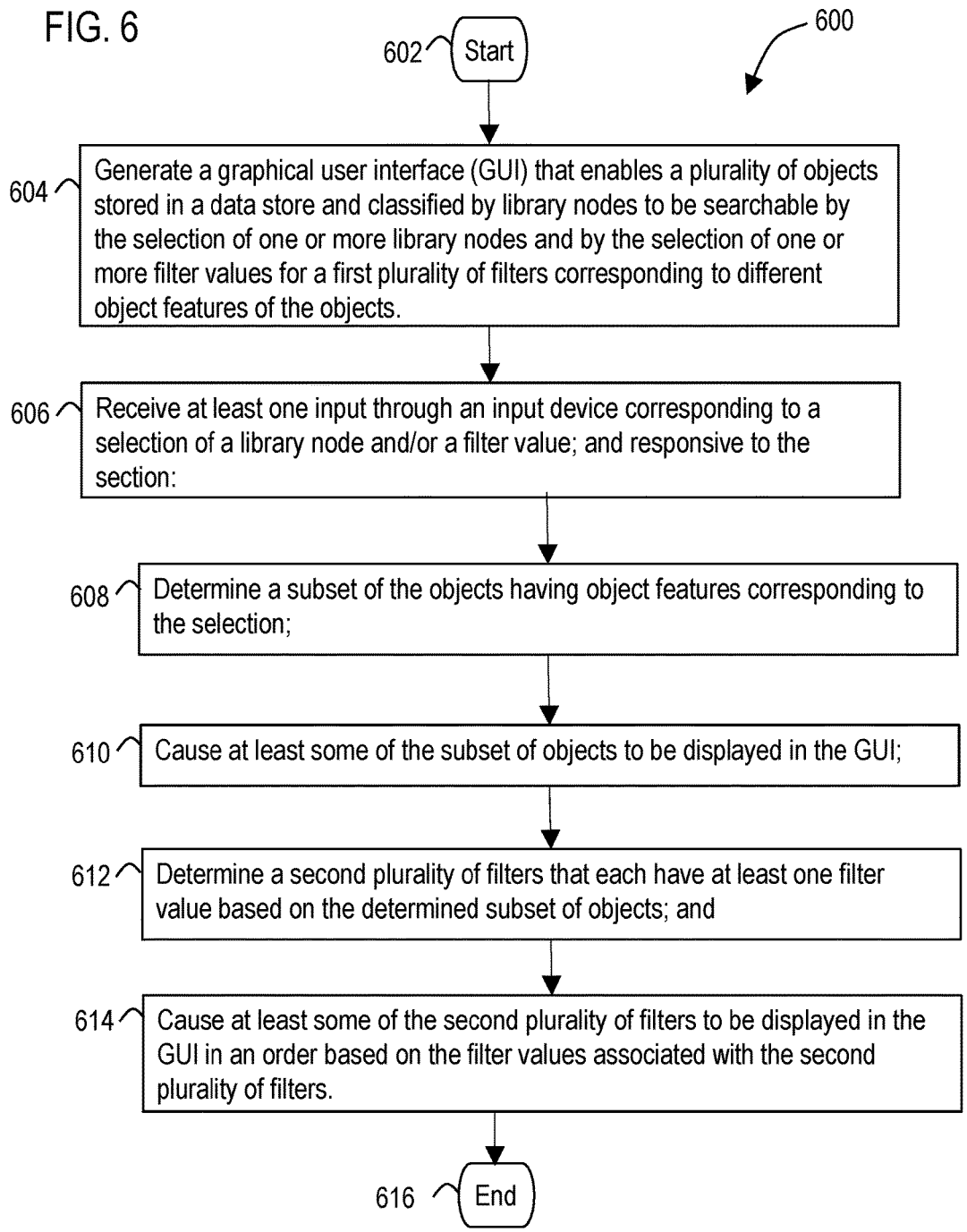
FIG. 6 illustrates a flow diagram of an example methodology that facilitates guided progressive searching of classified library content in a product system.

With reference now to FIG. 6, various example methodologies are illustrated and described. While the methodologies are described as being a series of acts that are performed in a sequence, it is to be understood that the methodologies may not be limited by the order of the sequence. For instance, some acts may occur in a different order than what is described herein. In addition, an act may occur concurrently with another act. Furthermore, in some instances, not all acts may be required to implement a methodology described herein.

It is important to note that while the disclosure includes a description in the context of a fully functional system and/or a series of acts, those skilled in the art will appreciate that at least portions of the mechanism of the present disclosure and/or described acts are capable of being distributed in the form of computer-executable instructions contained within non-transitory machine-usable, computer-usable, or computer-readable medium in any of a variety of forms, and that the present disclosure applies equally regardless of the particular type of instruction or data bearing medium or storage medium utilized to actually carry out the distribution. Examples of non-transitory machine usable/readable or computer usable/readable mediums include: ROMs, EPROMs, magnetic tape, floppy disks, hard disk drives, SSDs, flash memory, CDs, DVDs, and Blu-ray disks. The computer-executable instructions may include a routine, a sub-routine, programs, applications, modules, libraries, a thread of execution, and/or the like. Still further, results of acts of the methodologies may be stored in a computer-readable medium, displayed on a display device, and/or the like.

Referring now to FIG. 6, a methodology 600 that facilitates generation of ranked component models solutions representing the functional operation of multi-domain systems is illustrated. The method may start at 602 and the methodology may include several acts carried out through operation of at least one processor.

These acts may include an act 604 of generating a graphical user interface (GUI) that enables a plurality of objects stored in a data store and classified by library nodes to be searchable by the selection of one or more library nodes and by the selection of one or more filter values for a first plurality of filters corresponding to different object features of the objects. In addition the methodology may include the act 606 of receiving at least one input through an input device corresponding to a selection of a library node and/or a filter value. Also, the methodology may include the several acts carried out responsive to the selection including: an act 608 of determining a subset of the objects having object features corresponding to the selection; an act 610 of causing at least some of the subset of objects to be displayed in the GUI, and an act 612 of determining a second plurality of filters that each have at least one filter value based on the determined subset of objects; and an act 614 of causing at least some of the second plurality of filters to be displayed in the GUI in an order based on the filter values associated with the second plurality of filters. At 616 the methodology may end.

It should be appreciated that the methodology 600 may include other acts and features discussed previously with respect to the processing system 100. For example, the methodology may include causing the GUI to display the second plurality of filters in an order based at least in part on a total number of objects associated with each filter in the second plurality of filters.

In addition the methodology may include the act of causing the GUI to display the second plurality of filters in an order based at least in part on a determined number of different filter values associated with each filter in the second plurality of filters. For example the act may include causing the GUI to display the second plurality of filters in an order based at least in part on a determination of the relative closeness of the number of different filter values for each filter to a predetermined number.

Further, the methodology may include the act of causing the GUI to display the second plurality of filters in an order based on the range of the number of objects for the different filter values of each filter in the second plurality of filters.

In addition, in a further example, the methodology may include the act of causing the GUI to display the second plurality of filters in an order based at least in part on a determined number of different filter values associated with each filter in the second plurality of filters is equal to 1 and greater than 1. As discussed previously with respect to the system 100, in this example, filters with a total number of different filter values that are greater than 1 are displayed in the GUI vertically higher in the order than filters with a total number of different filter values that is equal to 1. Also, filters with a total number of different filter values that equal to 1 and that are not unassigned may be displayed in the GUI vertically higher in the order than filters with a total number of different filter values that equal 1 and that are unassigned.

Example embodiments of the methodology may also include the act of receiving at least one further input corresponding to a further selection of a filter value associated with the second plurality of filters. Responsive to this further selection, the methodology may include the acts of: determining a further subset of the objects based on the further selection; causing at least some of the further subset of objects to be displayed in the GUI; determining a third plurality of filters that each have at least one filter value based on the determined further subset of objects; and causing at least some of the third plurality of filters to be displayed in the GUI in an order based on the filter values associated with the third plurality of filters.

As discussed previously with respect to the system, the object features may correspond to object properties included by the object and library attributes associated with the object. The example methodology may be responsive to the further selection of the filter value associated with the second plurality of filters to: determine at least one further library node based on the determined further subset of objects; and cause the further library node to be displayed in the GUI.

In addition, the example methodology may include responsive to at least one input directed to generating a comparison table, an act of causing the GUI to display the comparison table based on the second plurality of filters.

Such a comparison table may depict object features corresponding to the second plurality of filters in a common list (such as a column or row) such that the object features are aligned (such as horizontally or vertically) with the respective object feature values displayed in adjacent lists (such as columns or rows) for at least two different objects. In this example, the order of the object features in the comparison table may correspond to the order of the second plurality of filters displayed in the GUI.

In addition, it should be appreciated that the objects returned by the search results in these examples may be used to carry out further acts. For example, some of the objects in the search results may correspond to or include CAD data (e.g., 3D models of parts). Such CAD data may be revised using CAD software (which may include the described application software component) and persisted back to the data store. Further acts associated with generating engineering drawings and/or a bill of materials (BOM) may then be carried out based on the CAD data. In addition, the methodology may include individuals manually building the structure based on the engineering drawings and/or BOM. Further such acts may include a machine (such as a 3D printer) building a structure (or a portion of the structure) based on the CAD data.

As discussed previously, acts associated with these methodologies (other than any described manual acts such as an act of manually building a structure) may be carried out by one or more processors. Such processor(s) may be included in one or more data processing systems, for example, that execute software components operative to cause these acts to be carried out by the one or more processors. In an example embodiment, such software components may comprise computer-executable instructions corresponding to a routine, a sub-routine, programs, applications, modules, libraries, a thread of execution, and/or the like. Further, it should be appreciated that software components may be written in and/or produced by software environments/languages/frameworks such as Java, JavaScript, Python, C, C#, C++ or any other software tool capable of producing components and graphical user interfaces configured to carry out the acts and features described herein.

Figure 7:
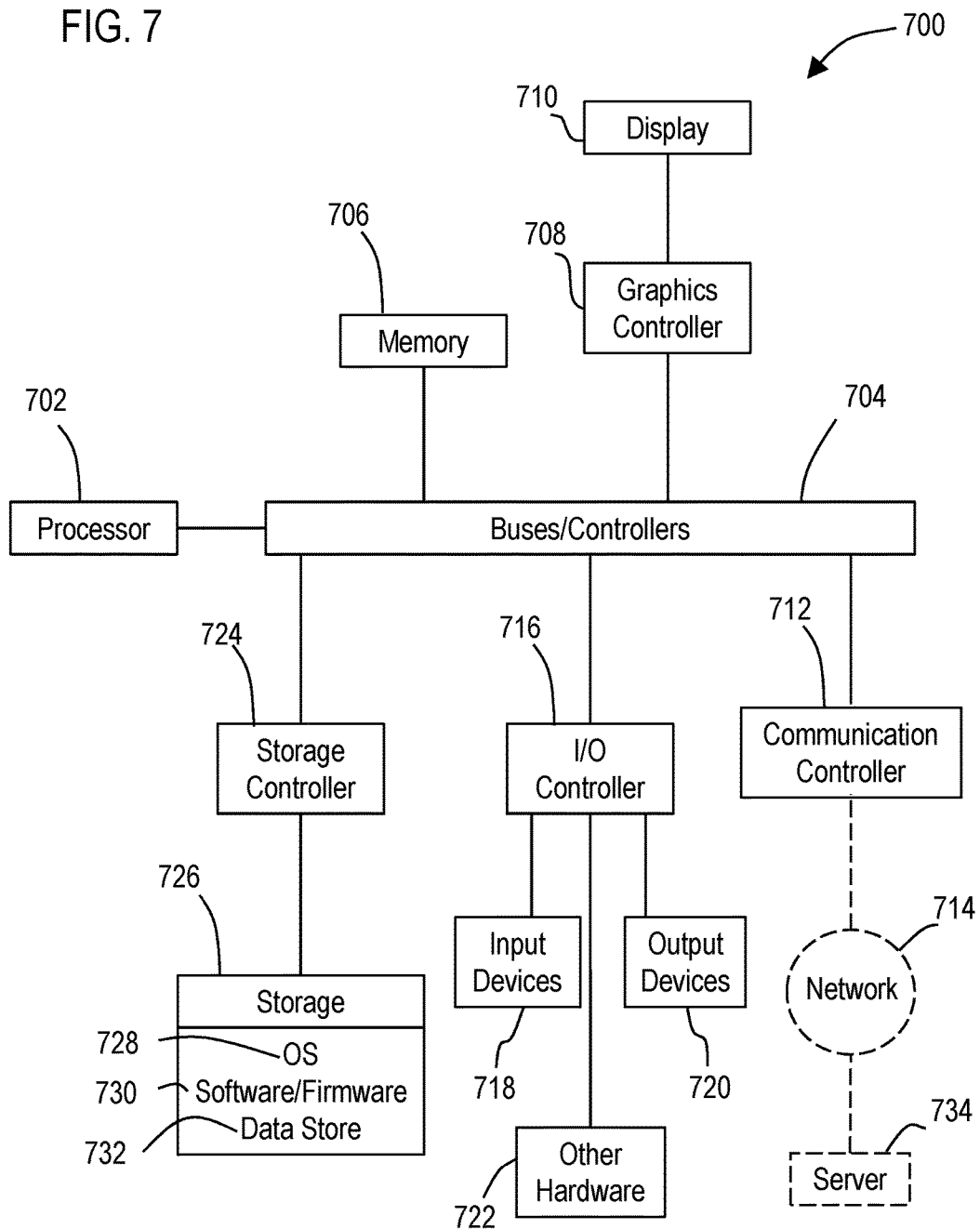
FIG. 7 illustrates a block diagram of a data processing system in which an embodiment can be implemented.

FIG. 7 illustrates a block diagram of a data processing system 700 (also referred to as a computer system) in which an embodiment can be implemented, for example, as a portion of a product system, and/or other system operatively configured by software or otherwise to perform the processes as described herein. The data processing system depicted includes at least one processor 702 (e.g., a CPU) that may be connected to one or more bridges/controllers/busses 704 (e.g., a north bridge, a south bridge). One of the buses 704, for example, may include one or more I/O buses such as a PCI Express bus. Also connected to various buses in the depicted example may include a main memory 706 (RAM) and a graphics controller 708. The graphics controller 708 may be connected to one or more display devices 710. It should also be noted that in some embodiments one or more controllers (e.g., graphics, south bridge) may be integrated with the CPU (on the same chip or die). Examples of CPU architectures include IA-32, x86-64, and ARM processor architectures.

Other peripherals connected to one or more buses may include communication controllers 712 (Ethernet controllers, WiFi controllers, cellular controllers) operative to connect to a local area network (LAN), Wide Area Network (WAN), a cellular network, and/or other wired or wireless networks 714 or communication equipment.

Further components connected to various busses may include one or more I/O controllers 716 such as USB controllers, Bluetooth controllers, and/or dedicated audio controllers (connected to speakers and/or microphones). It should also be appreciated that various peripherals may be connected to the I/O controller(s) (via various ports and connections) including input devices 718 (e.g., keyboard, mouse, pointer, touch screen, touch pad, drawing tablet, trackball, buttons, keypad, game controller, gamepad, camera, microphone, scanners, motion sensing devices that capture motion gestures), output devices 720 (e.g., printers, speakers) or any other type of device that is operative to provide inputs to or receive outputs from the data processing system. Also, it should be appreciated that many devices referred to as input devices or output devices may both provide inputs and receive outputs of communications with the data processing system. For example, the processor 702 may be integrated into a housing (such as a tablet) that includes a touch screen that serves as both an input and display device. Further, it should be appreciated that some input devices (such as a laptop) may include a plurality of different types of input devices (e.g., touch screen, touch pad, keyboard). Also, it should be appreciated that other peripheral hardware 722 connected to the I/O controllers 716 may include any type of device, machine, or component that is configured to communicate with a data processing system.

Additional components connected to various busses may include one or more storage controllers 724 (e.g., SATA). A storage controller may be connected to a storage device 726 such as one or more storage drives and/or any associated removable media, which can be any suitable non-transitory machine usable or machine readable storage medium. Examples, include nonvolatile devices, volatile devices, read only devices, writable devices, ROMs, EPROMs, magnetic tape storage, floppy disk drives, hard disk drives, solid-state drives (SSDs), flash memory, optical disk drives (CDs, DVDs, Blu-ray), and other known optical, electrical, or magnetic storage devices drives and/or computer media. Also in some examples, a storage device such as an SSD may be connected directly to an I/O bus 704 such as a PCI Express bus.

A data processing system in accordance with an embodiment of the present disclosure may include an operating system 728, software/firmware 730, and data stores 732 (that may be stored on a storage device 726 and/or the memory 706). Such an operating system may employ a command line interface (CLI) shell and/or a graphical user interface (GUI) shell. The GUI shell permits multiple display windows to be presented in the graphical user interface simultaneously, with each display window providing an interface to a different application or to a different instance of the same application. A cursor or pointer in the graphical user interface may be manipulated by a user through a pointing device such as a mouse or touch screen. The position of the cursor/pointer may be changed and/or an event, such as clicking a mouse button or touching a touch screen, may be generated to actuate a desired response. Examples of operating systems that may be used in a data processing system may include Microsoft Windows, Linux, UNIX, iOS, and Android operating systems. Also, examples of data stores include data files, data tables, relational database (e.g., Oracle, Microsoft SQL Server), database servers, or any other structure and/or device that is capable of storing data, which is retrievable by a processor.

The communication controllers 712 may be connected to the network 714 (not a part of data processing system 700), which can be any public or private data processing system network or combination of networks, as known to those of skill in the art, including the Internet. Data processing system 700 can communicate over the network 714 with one or more other data processing systems such as a server 734 (also not part of the data processing system 700). However, an alternative data processing system may correspond to a plurality of data processing systems implemented as part of a distributed system in which processors associated with several data processing systems may be in communication by way of one or more network connections and may collectively perform tasks described as being performed by a single data processing system. Thus, it is to be understood that when referring to a data processing system, such a system may be implemented across several data processing systems organized in a distributed system in communication with each other via a network.

Further, the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely.

In addition, it should be appreciated that data processing systems may be implemented as virtual machines in a virtual machine architecture or cloud environment. For example, the processor 702 and associated components may correspond to a virtual machine executing in a virtual machine environment of one or more servers. Examples of virtual machine architectures include VMware ESCi, Microsoft Hyper-V, Xen, and KVM.

Those of ordinary skill in the art will appreciate that the hardware depicted for the data processing system may vary for particular implementations. For example, the data processing system 700 in this example may correspond to a computer, workstation, server, PC, notebook computer, tablet, mobile phone, and/or any other type of apparatus/system that is operative to process data and carry out functionality and features described herein associated with the operation of a data processing system, computer, processor, and/or a controller discussed herein. The depicted example is provided for the purpose of explanation only and is not meant to imply architectural limitations with respect to the present disclosure.

Also, it should be noted that the processor described herein may be located in a server that is remote from the display and input devices described herein. In such an example, the described display device and input device may be included in a client device that communicates with the server (and/or a virtual machine executing on the server) through a wired or wireless network (which may include the Internet). In some embodiments, such a client device, for example, may execute a remote desktop application or may correspond to a portal device that carries out a remote desktop protocol with the server in order to send inputs from an input device to the server and receive visual information from the server to display through a display device. Examples of such remote desktop protocols include Teradici's PCoIP, Microsoft's RDP, and the RFB protocol. In such examples, the processor described herein may correspond to a virtual processor of a virtual machine executing in a physical processor of the server.

As used herein, the terms "component" and "system" are intended to encompass hardware, software, or a combination of hardware and software. Thus, for example, a system or component may be a process, a process executing on a processor, or a processor. Additionally, a component or system may be localized on a single device or distributed across several devices.

Also, as used herein a processor corresponds to any electronic device that is configured via hardware circuits, software, and/or firmware to process data. For example, processors described herein may correspond to one or more (or a combination) of a microprocessor, CPU, FPGA, ASIC, or any other integrated circuit (IC) or other type of circuit that is capable of processing data in a data processing system, which may have the form of a controller board, computer, server, mobile phone, and/or any other type of electronic device.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 700 may conform to any of the various current implementations and practices known in the art.

Also, it should be understood that the words or phrases used herein should be construed broadly, unless expressly limited in some examples. For example, the terms "include" and "comprise," as well as derivatives thereof, mean inclusion without limitation. The singular forms "a", "an" and "the" are intended to include the plural forms as well, unless the context clearly indicates otherwise. Further, the term "and/or" as used herein refers to and encompasses any and all possible combinations of one or more of the associated listed items. The term "or" is inclusive, meaning and/or, unless the context clearly indicates otherwise. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Also, although the terms "first", "second", "third" and so forth may be used herein to describe various elements, functions, or acts, these elements, functions, or acts should not be limited by these terms. Rather these numeral adjectives are used to distinguish different elements, functions or acts from each other. For example, a first element, function, or act could be termed a second element, function, or act, and, similarly, a second element, function, or act could be termed a first element, function, or act, without departing from the scope of the present disclosure.

In addition, phrases such as "processor is configured to" carry out one or more functions or processes, may mean the processor is operatively configured to or operably configured to carry out the functions or processes via software, firmware, and/or wired circuits. For example, a processor that is configured to carry out a function/process may correspond to a processor that is executing the software/firmware, which is programmed to cause the processor to carry out the function/process and/or may correspond to a processor that has the software/firmware in a memory or storage device that is available to be executed by the processor to carry out the function/process. It should also be noted that a processor that is "configured to" carry out one or more functions or processes, may also correspond to a processor circuit particularly fabricated or "wired" to carry out the functions or processes (e.g., an ASIC or FPGA design). Further the phrase "at least one" before an element (e.g., a processor) that is configured to carry out more than one function may correspond to one or more elements (e.g., processors) that each carry out the functions and may also correspond to two or more of the elements (e.g., processors) that respectively carry out different ones of the one or more different functions.

In addition, the term "adjacent to" may mean: that an element is relatively near to but not in contact with a further element; or that the element is in contact with the further portion, unless the context clearly indicates otherwise.

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, act, or function is an essential element, which must be included in the claim scope: the scope of patented subject matter is defined only by the allowed claims. Moreover, none of these claims are intended to invoke 35 USC § 112(f) unless the exact words "means for" are followed by a participle.

What is claimed is:

1. An apparatus for guided progressive searching comprising:
    at least one processor configured to generate a graphical user interface (GUI) through a display device that enables a plurality of objects stored in a data store and classified by library nodes to be searchable via a selection of one or more library nodes and a selection of one or more filter values for a first plurality of filters corresponding to different object features of the objects,
    wherein the at least one processor is configured to be responsive to at least one input through an input device corresponding to a selection of a library node and/or a filter value:
        to determine a subset of the objects having object features corresponding to the selection;
        to cause at least some of the subset of objects to be displayed in the GUI;
        to determine a second plurality of filters that each have at least one filter value based on the determined subset of objects; and
        to cause at least some of the second plurality of filters to be displayed in the GUI in an order based on whether a determined number of different filter values associated with each filter in the second plurality of filters is equal to 1 or greater than 1, wherein filters of the second plurality of filters with a total number of different filter values that are greater than 1 are ordered higher in the order than filters of the second plurality of filters with a total number of different filter values that are equal to 1.

2. The apparatus according to claim 1, wherein the at least one processor is configured to cause the second plurality of filters to be displayed in the GUI in an order based at least in part on a total number of objects associated with each filter in the second plurality of filters.

3. The apparatus according to claim 2, wherein the at least one processor is configured to cause the second plurality of filters to be displayed in the GUI in an order based at least in part on a determination of the relative closeness of the number of different filter values for each filter to a predetermined number.

4. The apparatus according to claim 3, wherein the at least one processor is configured to cause the second plurality of filters to be displayed in the GUI in an order based at least in part on the range of the number of objects for the different filter values of each filter in the second plurality of filters.

5. The apparatus according to claim 4, wherein the at least one processor is configured to cause the second plurality of filters to be displayed in the GUI in an order based at least in part on a determined number of different filter values associated with each filter in the second plurality of filters is equal to 1 and greater than 1, wherein filters with a total number of different filter values that are greater than 1 are displayed in the GUI vertically higher in the order than filters with a total number of different filter values that is equal to 1, wherein filters with a total number of different filter values that equal to 1 and that are not unassigned are displayed in the GUI vertically higher in the order than filters with a total number of different filter values that equal 1 and that are unassigned.

6. The apparatus according to claim 1, wherein the at least one processor configured to be responsive to at least one further input through the input device corresponding to a further selection of at least one filter value associated with the second plurality of filters: to determine a further subset of the objects based on the further selection; to cause at least some of the further subset of objects to be displayed in the GUI; to determine a third plurality of filters that each have at least one filter value based on the determined further subset of objects; and to cause at least some of the third plurality of filters to be displayed in the GUI in an order based on the filter values associated with the third plurality of filters.

7. The apparatus according to claim 6, wherein for each object, the object features correspond to object properties included by the object and library attributes associated with the object, wherein the at least one processor is responsive to the further selection of the filter value associated with the second plurality of filters: to determine at least one further library node based on the determined further subset of objects; and to cause the at least one further library node to be displayed in the GUI.

8. The apparatus according to claim 1, wherein the at least one processor is responsive to at least one further input through the input device directed to generating a comparison table, to cause the GUI to display the comparison table based on the second plurality of filters, which comparison table depicts object features corresponding to the second plurality of filters in a common list such that the object features are aligned with the respective object feature values displayed in adjacent lists for at least two different objects, wherein the order of the object features in the comparison table corresponds to the order of the second plurality of filters displayed in the GUI.

9. The apparatus according to claim 1, further comprising a computer system including a memory, an application software component, the at least one processor, the display device, and the input device, wherein the application software component is comprised of instructions that when included in the memory and executed by the at least one processor, cause the at least one processor to generate the GUI through the display device responsive to inputs through the input device.

10. A method comprising:
    through operation of at least one processor:
        generating a graphical user interface (GUI) that enables a plurality of objects stored in a data store and classified by library nodes to be searchable by the selection of one or more library nodes and by the selection of one or more filter values for a first plurality of filters corresponding to different object features of the objects;

receiving at least one input through an input device corresponding to a selection of a library node and/or a filter value; and responsive to the selection:

determining a subset of the objects having object features corresponding to the selection;

causing at least some of the subset of objects to be displayed in the GUI;

determining a second plurality of filters that each have at least one filter value based on the determined subset of objects; and causing at least some of the second plurality of filters to be displayed in the GUI in an order based on whether a determined number of different filter values associated with each filter in the second plurality of filters is equal to 1 or greater than 1, wherein filters of the second plurality of filters with a total number of different filter values that are greater than 1 are ordered higher in the order than filters of the second plurality of filters with a total number of different filter values that are equal to 1.

11. The method according to claim 10, through operation of the at least one processor, causing the GUI to display the second plurality of filters in an order based at least in part on a total number of objects associated with each filter in the second plurality of filters.

12. The method according to claim 11, through operation of the at least one processor, causing the GUI to display the second plurality of filters in an order based at least in part on a determination of the relative closeness of the number of different filter values for each filter to a predetermined number.

13. The method according to claim 12, through operation of the at least one processor, causing the GUI to display the second plurality of filters in an order based at least in part on the range of the number of objects for the different filter values of each filter in the second plurality of filters.

14. The method according to claim 13, through operation of the at least one processor, causing the GUI to display the second plurality of filters in an order based at least in part on a determined number of different filter values associated with each filter in the second plurality of filters is equal to 1 and greater than 1, wherein filters with a total number of different filter values that are greater than 1 are displayed in the GUI vertically higher in the order than filters with a total number of different filter values that is equal to 1, wherein filters with a total number of different filter values that equal to 1 and that are not unassigned are displayed in the GUI vertically higher in the order than filters with a total number of different filter values that equal 1 and that are unassigned.

15. The method according to claim 10, further comprising, through operation of at least one processor:

receiving at least one further input corresponding to a further selection of a filter value associated with the second plurality of filters; and responsive to the further selection:

determining a further subset of the objects based on the further selection;

causing at least some of the further subset of objects to be displayed in the GUI;

determining a third plurality of filters that each have at least one filter value based on the determined further subset of objects; and causing at least some of the third plurality of filters to be displayed in the GUI in an order based on the filter values associated with the third plurality of filters.

16. The method according to claim 15, wherein for each object, the object features correspond to object properties included by the object and library attributes associated with the object, further comprising:

through operation of the at least one processor responsive to the further selection of the filter value associated with the second plurality of filters:

determining at least one further library node based on the determined further subset of objects; and causing the further library node to be displayed in the GUI.

17. The method according to claim 10, further comprising, through operation of the at least one processor responsive to at least one input directed to generating a comparison table:

causing the GUI to display the comparison table based on the second plurality of filters, wherein the comparison table depicts object features corresponding to the second plurality of filters in a common list such that the object features are aligned with the respective object feature values displayed in adjacent lists for at least two different objects, wherein the order of the object features in the comparison table corresponds to the order of the second plurality of filters displayed in the GUI.

18. A non-transitory computer readable medium encoded with executable instructions that when executed, cause at least one processor to:

generate a graphical user interface (GUI) that enables a plurality of objects stored in a data store and classified by library nodes to be searchable by the selection of one or more library nodes and by the selection of one or more filter values for a first plurality of filters corresponding to different object features of the objects;

receive at least one input through an input device corresponding to a selection of a library node and/or a filter value; and responsive to the selection:

determine a subset of the objects having object features corresponding to the selection;

cause at least some of the subset of objects to be displayed in the GUI;

determine a second plurality of filters that each have at least one filter value based on the determined subset of objects; and cause at least some of the second plurality of filters to be displayed in the GUI in in an order based on whether a determined number of different filter values associated with each filter in the second plurality of filters is equal to 1 or greater than 1, wherein filters of the second plurality of filters with a total number of different filter values that are greater than 1 are ordered higher in the order than filters of the second plurality of filters with a total number of different filter values that are equal to 1.

19. The non-transitory computer readable medium of claim 18, wherein the executable instructions, when executed, further cause the at least one processor to cause the second plurality of filters to be displayed in the GUI in an order based at least in part on a total number of objects associated with each filter in the second plurality of filters.

20. The non-transitory computer readable medium of claim 19, wherein the executable instructions, when executed, further cause the at least one processor to cause the second plurality of filters to be displayed in the GUI in an order based at least in part on a determination of the relative closeness of the number of different filter values for each filter to a predetermined number.

\* \* \* \* \*